United States Patent
Taguwa

(10) Patent No.: US 7,078,747 B2
(45) Date of Patent: Jul. 18, 2006

(54) SEMICONDUCTOR DEVICE HAVING A HMP METAL GATE

(75) Inventor: Tetsuya Taguwa, Tokyo (JP)

(73) Assignee: Elpida Memory, Inc. (JP)

( * ) Notice: Subject to any disclaimer, the term of this patent is extended or adjusted under 35 U.S.C. 154(b) by 13 days.

(21) Appl. No.: 10/959,213

(22) Filed: Oct. 6, 2004

(65) Prior Publication Data

US 2005/0073011 A1  Apr. 7, 2005

(30) Foreign Application Priority Data

Oct. 6, 2003  (JP) .............................. 2003-347265

(51) Int. Cl.
*H01L 27/148* (2006.01)

(52) U.S. Cl. ...................... 257/249; 257/274; 257/351; 257/338; 257/388

(58) Field of Classification Search .............. 257/249, 257/274, 351, 338, 388
See application file for complete search history.

(56) References Cited

FOREIGN PATENT DOCUMENTS

| JP | 11-233451 | 8/1999 |
|---|---|---|
| JP | 2003163348 | 6/2003 |

*Primary Examiner*—Fetsum Abraham
(74) *Attorney, Agent, or Firm*—Hayes Soloway P.C.

(57) ABSTRACT

A semiconductor device has a dual-gate electrode structure. The gate electrode has a layered structure including a doped polysilicon film, $WSi_2$ film, WN film and a W film. The $WSi_2$ film formed on the polysilicon film in the P-channel area is formed of a number of $WSi_2$ particles disposed apart from one another, preventing a bilateral diffusion of impurities doped in the polysilicon film.

15 Claims, 8 Drawing Sheets

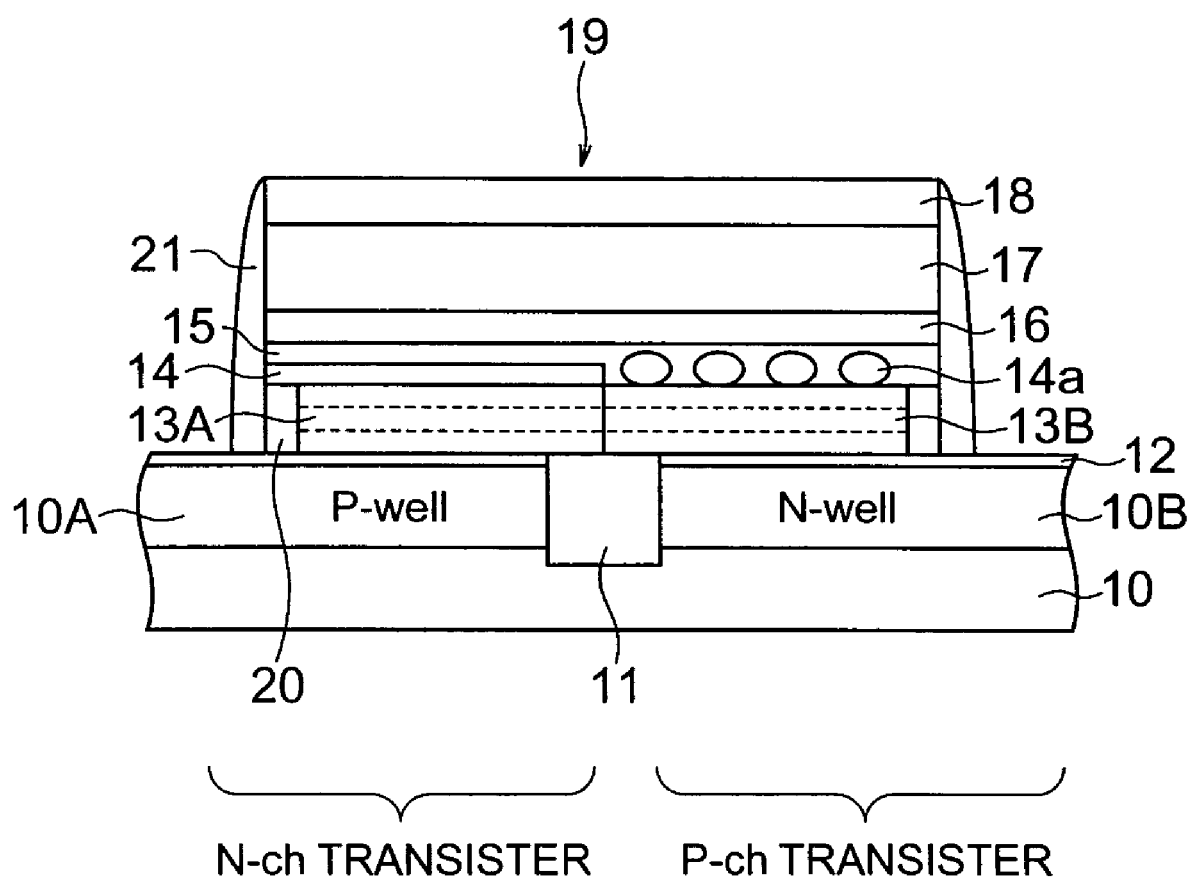

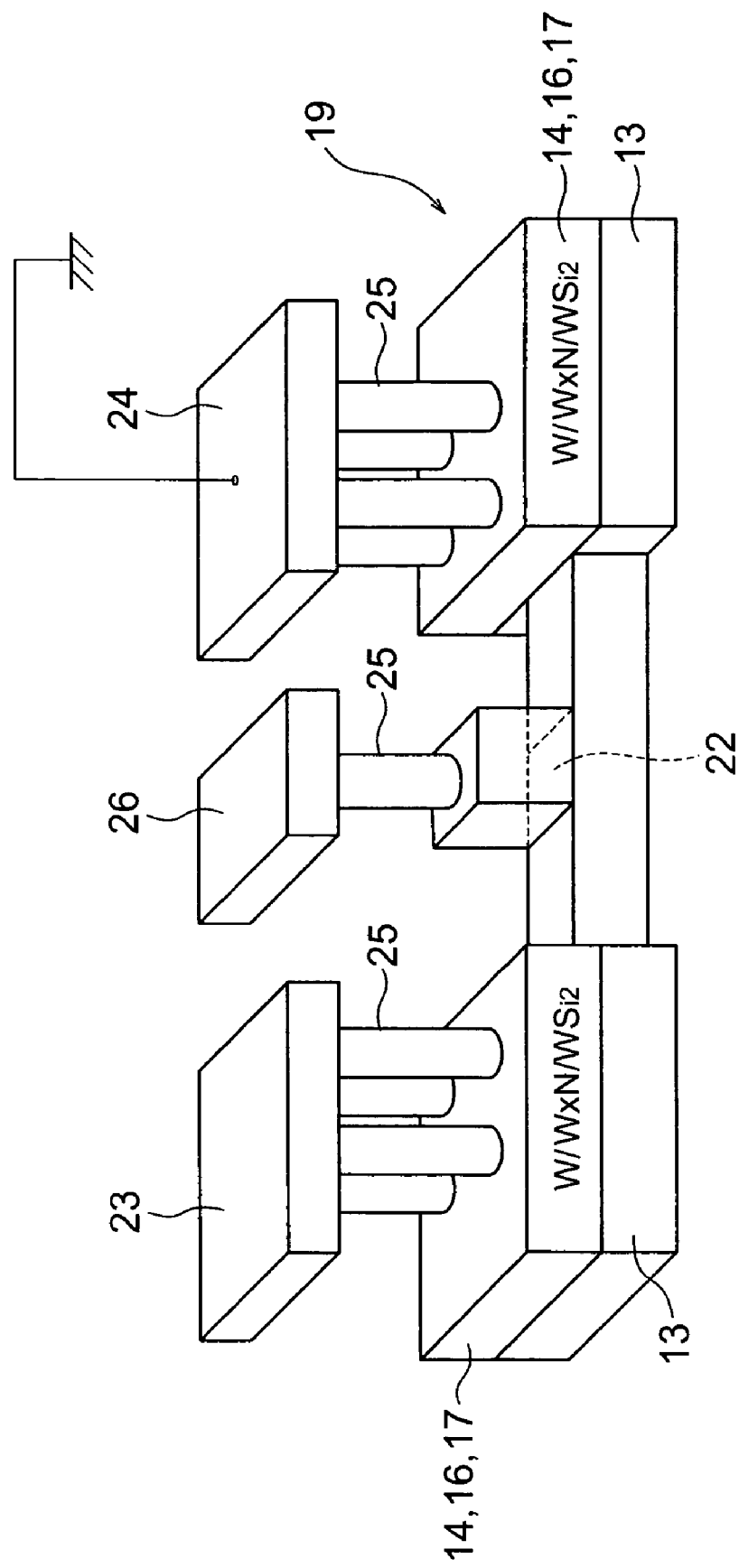

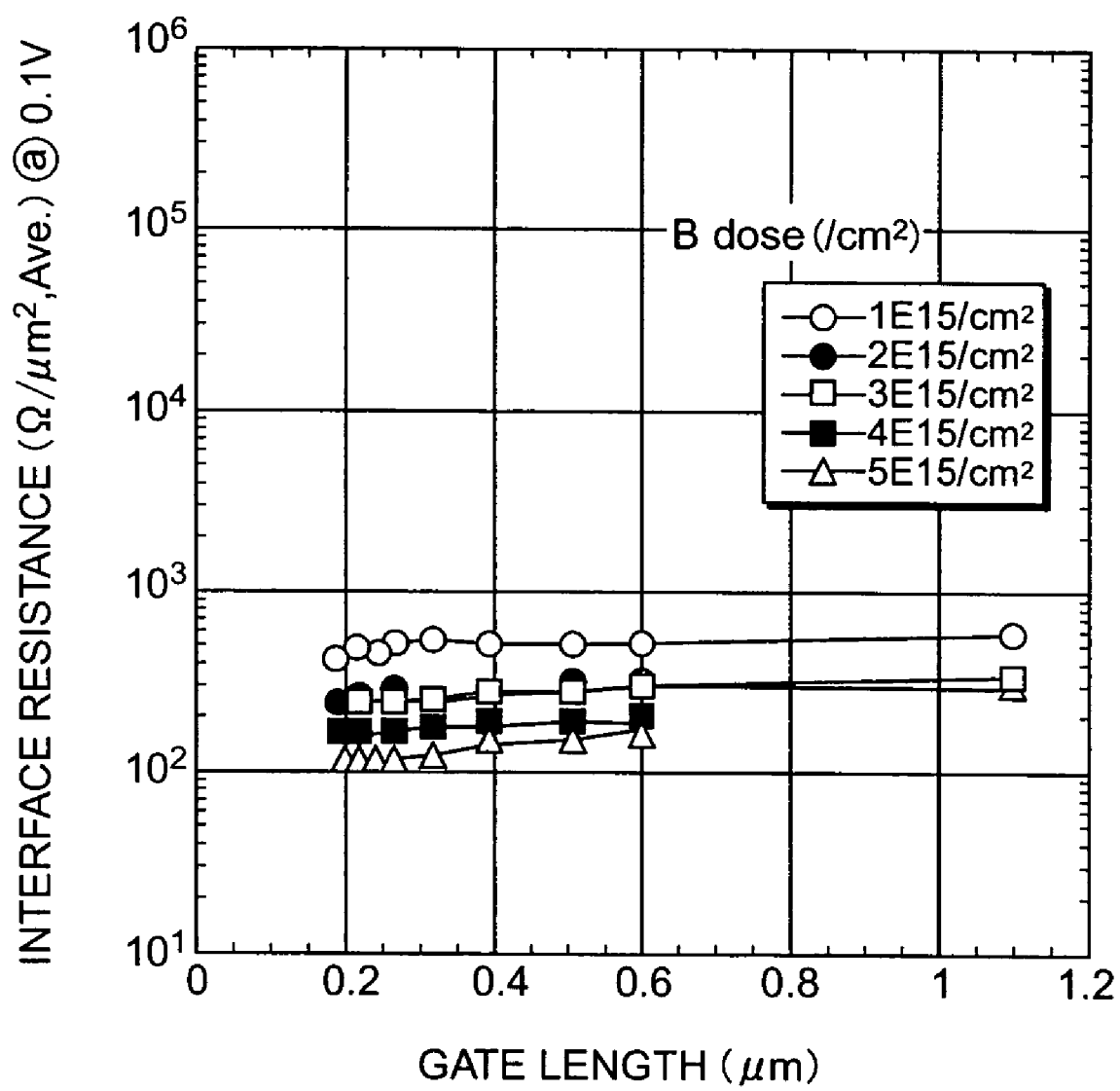

SEMICONDUCTOR DEVICE HAVING A HMP METAL GATE

BACKGROUND OF THE INVENTION (a) Field of the Invention

The present invention relates to a semiconductor device having a HMP (high-melting-point) metal gate suited to a dual-gate structure wherein a P-channel transistor and an N-channel transistor share a gate structure. The present invention also relates to a method for manufacturing such a semiconductor device.

(b) Description of the Related Art

An LSI having a gate electrode including a HMP metal, such as tungsten (W), is known to have a higher operational speed and a higher resistance against the heat applied in the fabrication steps thereof. The HMP metal gate is generally formed by consecutively depositing a thin polysilicon film and a HMP metal film having a lower electric resistance on a gate oxide film.

It is known in such an LSI that a HMP metal silicide is formed by depositing a HMP metal film directly on a polysilicon film and performing a high-temperature heat treatment thereto, which causes the HMP metal to react with silicon at the interface between the films. The HMP metal silicide film has a relatively higher electric resistance however, and accordingly, the formation of the HMP metal silicide film should be suppressed for achieving a higher operational speed of the transistors in the LSI. Patent Publication JP-A-11(1999)-233451 describes a technique for suppressing the silicide reaction of the HMP metal during the heat treatment, by forming a HMP metal nitride film, such as including WN, at the interface between the HMP metal film and the polysilicon film.

However, during the heat treatment after formation of the metal nitride film directly on the polysilicon film, the HMP metal nitride film strongly reacts with Si in the polysilicon film, thereby forming a thick HMP metal silicide nitride film. Although the thick HMP metal silicide nitride film has an excellent barrier function, the thick HMP metal silicide nitride film may have a higher electric resistance due to a possible high resistivity of the HMP metal silicide nitride depending on the composition thereof or the layered structure of the gate electrode. The higher electric resistance prevents the semiconductor device from achieving a higher operational speed.

The present inventor proposed a technique for forming a gate electrode in Patent Publication JP-A-2003-163348. In the publication, a HMP metal silicide film having a relatively lower electric resistance is interposed between the polysilicon film and the HMP metal nitride film, followed by performing a heat treatment for the layered structure as a whole including the HMP metal silicide film, HMP metal nitride film and HMP metal film to form a thin HMP metal silicide nitride film.

The present inventor further studied the technique for forming the gate electrode in the LSI and found that the technique described in JP-A-2003-163348, if applied to a LSI having a dual-gate structure and thus including an N-channel area and a P-channel area located adjacent to one another, causes the problem of increase in the interface resistance and increase in the film thickness in terms of the thickness of the silicon.

The above problem results from the fact that the diffusion coefficient of the impurities is higher in the HMP metal silicide film than in the silicon film by three to six orders, and that the N-type impurities in the polysilicon film in the N-channel area and the P-type impurities in the polysilicon film in the P-channel area are absorbed by the HMP metal silicide film during the heat treatment, causing a bilateral diffusion of the N-type and P-type impurities between the N-channel area and the P-channel area. It is also found that the amount of the impurities diffused from the P-channel area to the N-channel area of the gate electrode in the pair is especially large, to thereby reduce the electric conductivity of the gate electrode.

SUMMARY OF THE INVENTION

In view of the above problem in the conventional technique, it is an object of the present invention to provide a semiconductor device having a lower resistance in the gate electrode and thus having a higher operational speed, by suppressing the bilateral diffusion of impurities in the gate electrode between the N-channel area and the P-channel area.

It is another object of the present invention to provide a method for manufacturing such a semiconductor device.

The present invention provides a semiconductor device including: a semiconductor substrate having an N-channel area and a P-channel area; and an N-channel transistor and a P-channel transistor formed in the N-channel area and the P-channel area, respectively, the N-channel transistor and the P-channel transistor having respective gate electrodes each having a layered structure including a polysilicon film doped with impurities, a high-melting-point (HMP) metal silicide film, a HMP metal nitride film and a HMP metal film, wherein the HMP metal silicide film of the gate electrode of the P-channel transistor has a discontinuous film structure.

The present invention also provides a method for manufacturing a semiconductor device including the steps of: forming a gate oxide film on a semiconductor substrate including an N-channel area and a P-channel area in pair; depositing a silicon film including polysilicon or amorphous silicon on the gate oxide film; doping a first portion of the silicon film in the P-channel area with P-type impurities at a dosage of $1 \times 10^{15}$ to $5 \times 10^{15}$ ions/cm$^2$, and a second portion of the silicon film in the N-channel area with N-type impurities; depositing a high-melting-point (HMP) metal silicide film on the doped silicon film at a uniform deposition rate between the P-channel area and the N-channel area, the uniform deposition rate depositing the HMP metal silicide film to a thickness of 3 to 10 nm; and forming N-channel transistor and P-channel transistor in the N-channel area and the P-channel area, respectively, the N-channel transistor and P-channel transistor having respective gate electrodes, the gate electrodes including the doped polysilicon film, the HMP metal silicide film, a HMP metal nitride film and a HMP metal film.

In accordance with the semiconductor device of the present invention, the HMP metal silicide film having a discontinuous film structure in the gate electrode of the P-channel transistor physically prevents the bilateral diffusion of impurities in the doped silicon film between the P-channel area and the N-cannel area, thereby preventing reduction of the conductivity of the gate electrode and achieving a higher operational speed of the semiconductor device.

The method of the present invention provides the semiconductor device of the present invention having such an advantage.

The above and other objects, features and advantages of the present invention will be more apparent from the following description, referring to the accompanying drawings.

BRIEF DESCRIPTION OF THE DRAWINGS

FIG. 1 is a sectional view of a gate structure in a semiconductor device according to an embodiment of the present invention.

FIG. 5 is a schematic diagram showing an example of measurement of the interface resistance.

FIG. 8 is a graph showing the relationship between the interface resistance and the gate width for different dosage of the gate electrode.

PREFERRED EMBODIMENT OF THE INVENTION

Figure 2A:
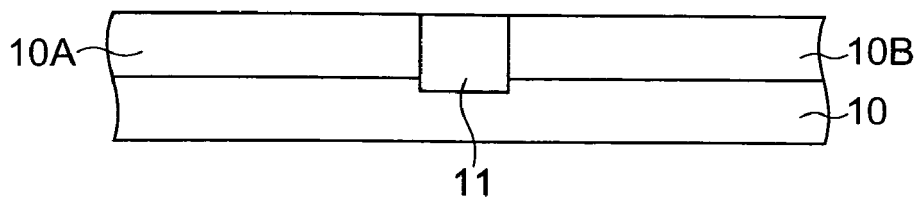
FIGS. 2A to 2G are sectional views of the gate structure of FIG. 1, showing consecutive steps of fabrication thereof.

Now, the present invention is more specifically described with reference to accompanying drawings.

Referring to FIG. 1, a semiconductor device according to an embodiment of the present invention has a dual-gate structure wherein a large number of pairs each including a P-well 10A and an N-well 10B adjacent to each other are formed on a silicon substrate 10. The semiconductor device includes a gate electrode 19 overlying the silicon substrate 10, on which a silicon oxide film (element isolation film) 11 is formed in the surface region thereof for isolation between the P-well 10A and the N-well 10B. The P-well 10A is doped with boron (B) whereas the N-well 10B is doped with phosphor (P). A 4-nm-thick gate oxide film 12 is formed on the silicon substrate 10 except for the element isolation film 11.

On the element isolation film 11 and the gate oxide film 12, is formed a layered structure including a 100-nm-thick polysilicon film 13 (13A, 13B), a tungsten silicide ($WSi_2$) film 14, a 2- to 5-nm-thick tungsten silicide nitride (WSiN) film 15, a 10-nm-thick tungsten nitride (WN) film 16, a 80-nm-thick tungsten (W) film 17, and a 200-nm-thick silicon nitride film (SiN) film 18. SiN side-wall films 21 are formed on both the side walls of the gate electrode 19.

The polysilicon film includes an N-type portion 13A doped with an N-type dopant and formed on the P-well 10A and a portion of the element isolation film 11, and a P-type portion 13B doped with a P-type dopant and formed on the N-well 10B and a portion of the element isolation film 11. The N-type portion 13A of the polysilicon film is doped with phosphor at an acceleration energy of 10 keV and a dosage of $5 \times 10^{15}$ ions/cm$^2$, whereas the P-type portion 13B of the polysilicon film is doped with boron at an acceleration energy of 5 keV and a dosage of $1 \times 10^{15}$ to $5 \times 10^{15}$ ions/cm$^2$, more preferably $3 \times 10^{15}$ to $5 \times 10^{15}$ ions/cm$^2$.

A portion of the $WSi_2$ film 14 on the N-type portion 13A of the polysilicon film preferably has a thickness of 3 to 10 nm, and more preferably a thickness of 5 to 7 nm. Another portion of the $WSi_2$ film 14 on the P-type portion 13B of the polysilicon film is formed of a large number of flat $WSi_2$ particles 14a separated from on another, and has a thickness equal to the thickness of the portion of the $WSi_2$ film 4 formed on the N-type portion 13A of the polysilicon film. Setting the dosage of the P-type portion 13B of the polysilicon film at $3 \times 10^{15}$ to $5 \times 10^{15}$ boron ions/cm$^2$ and setting the film thickness of the $WSi_2$ film at 5 to 7 nm can provide a configuration wherein the $WSi_2$ particles 14a have grain sizes of around 5 to 30 nm, and are separated from one another with gaps of 2 to 80 nm between adjacent particles 14a.

The WSiN film 15 is disposed in direct contact with the P-type portion 13B of the polysilicon film through the gaps between the $WSi_2$ particles 14a.

In the gate electrode 19 formed in the present embodiment, the portion of the $WSi_2$ film 14, formed of the flat $WSi_2$ particles 14a separated from one another as described above, suppresses the bilateral diffusion of impurities. More specifically, the phosphor in the N-type portion 13A of the polysilicon film and the boron in the P-type portion 13B are physically suppressed from the diffusion thereof between the N-type portion 13A and the P-type portion 13B by the structure of the $WSi_2$ film 14 formed of the $WSi_2$ particles. This suppresses the rise of the interface resistance between the W film 17 and the polysilicon film 13 to achieve a gate electrode having a lower resistance.

FIGS. 2A to 2G consecutively show fabrication steps for fabricating the gate structure in the semiconductor device of the present embodiment. First, an element isolation film 11 is selectively formed on a surface region of a silicon substrate 10 by using a shallow trench isolation (STI) technique. Subsequently, boron ions (B+) are implanted in the silicon substrate 10 by using a resist mask (not shown) to form a P-well 10A in a surface region of the silicon substrate 10. Further, phosphorous ions (P+) are implanted into a surface region of the silicon substrate 10 by using another resist mask (not shown) to form an N-well 10B, to obtain the structure of FIG. 2A.

Figure 2B:
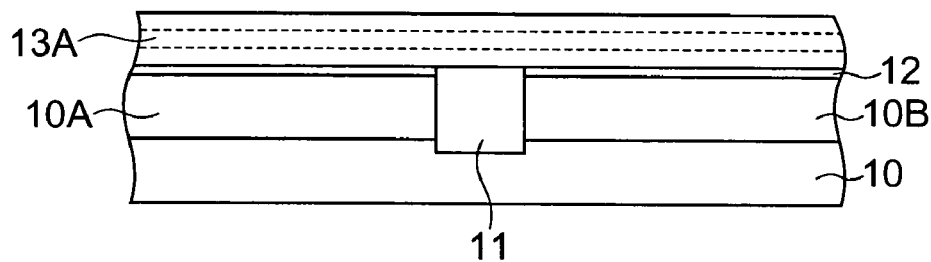

Thereafter, the silicon substrate 10 is received in a chamber, wherein a heat treatment is conducted at a temperature of 850 degrees C. for four hours in a steam and oxygen gas ambient, thereby forming a 4-nm-thick gate oxide film 12 on the silicon substrate 10 except for the region of the element isolation film 11. Subsequently, an undoped amorphous silicon film 13a is formed on the element isolation film 11 and the gate oxide film 12 by using a CVD (chemical vapor deposition) technique, as shown in FIG. 2B. The amorphous silicon film 13a has a three-layer structure as shown by dotted lines in FIG. 2B, wherein the amorphous silicon film 13a is deposited in three separate growth steps. The deposition is conducted while supplying monosilane ($SiH_4$) at a flow rate of 3000 sccm (standard cubic centimeters per minute) while maintaining the internal pressure of the chamber at 100 Pa and the substrate temperature at 580 degrees C. The time length for the deposition step is an hour, for example.

Subsequently, implantation of phosphorous ions into the amorphous silicon film 13a is performed using a resist mask at an acceleration energy of 5 keV and a dosage of $5 \times 10^{15}$ ions/cm$^2$, thereby forming the N-type portion 13A of the amorphous silicon film. Further, implantation of boron ions into the amorphous silicon film 13a is performed using another resist mask at an acceleration energy of 5 keV and a dosage of $1 \times 10^{15}$ to $5 \times 10^{15}$ ions/cm$^2$, thereby forming the P-type portion 13B of the amorphous silicon film. In the implantation step, boron difluoride (BF$_2^+$) may be implanted into the P-type portion 13B instead of boron while suitably adjusting the acceleration energy. In this case, the depth of the shallow ion implantation can be controlled more accurately due to the larger mass of the boron difluoride compared to the boron.

Figure 2C:
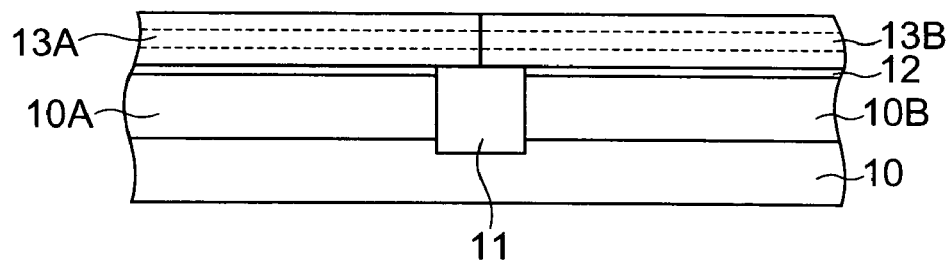

Thereafter, the doped amorphous silicon film 13a is subjected to a cleaning step using a mixture of hydrofluoric (HF) acid and hydrogen peroxide solution to remove a native oxide film formed on the surface, to obtain the structure of FIG. 2C.

Figure 2D:
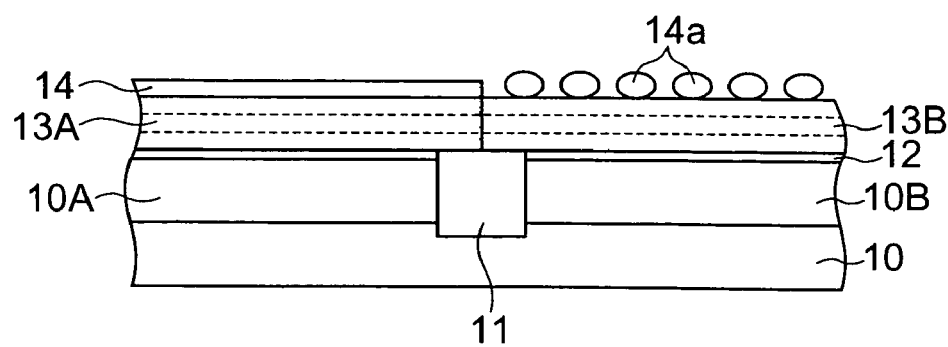

Subsequently, as shown in FIG. 2D, a 3- to 10-nm-thick WSi$_2$ film 14 is deposited on the doped amorphous silicon film 13a by using a CVD technique. In this deposition, dichlorosilane (SiH$_2$Cl$_2$) and tungsten hexafluoride (WF$_6$) are supplied at flow rates of 200 sccm and 2 sccm, respectively, while maintaining the internal pressure of the vacuum chamber at around 30 to 100 Pa, thereby reacting the silicon substrate 10 received in the vacuum chamber at 550 degrees C. for 30 seconds.

In the above deposition step, a WSi$_2$ film 14 having a discontinuous structure is formed on the P-type portion 13B of the amorphous silicon film. More specifically, a large number of WSi$_2$ particles 14a separated from one another are formed on the P-type portion 13B of the amorphous silicon film, because the P-type portion 13B is doped with boron ions at a dosage of $1 \times 10^{15}$ to $5 \times 10^{15}$ ions/cm$^2$ and because the deposition thickness of the WSi$_2$ film 14 is selected at 3 to 10 nm. On the other hand, a uniform WSi$_2$ film 14 is formed on the N-type portion 13A of the amorphous silicon film.

It is to be noted that a higher dosage of boron ions for the P-type portion 13B of the amorphous silicon film increases the gap between the adjacent WSi$_2$ particles 14a in the WSi$_2$ film 14 deposited on the P-type portion 13B. It is preferable that the dosage of boron ions be set at $3 \times 10^{15}$ to $5 \times 10^{15}$ ions/cm$^2$. A larger deposition thickness of the WSi$_2$ increases the grain sizes of the individual WSi$_2$ particles. It is preferable that the deposition thickness of the WSi$_2$ be set at 5 to 7 nm.

In a preferred embodiment of the present invention, the WSi$_2$ particles 14a are formed on the P-type portion 13B at a deposition thickness of 5 to 7 nm after the P-type portion 13B is doped with boron ions at $3 \times 10^{15}$ to $5 \times 10^{15}$ ion/cm$^2$. This provides preferable grain sizes of 5 to 30 nm for the WSi$_2$ particles and preferable gaps of 2 to 80 nm between adjacent WSi$_2$ particles.

The amount of tungsten atoms deposited on the P-type portion 13B of the amorphous silicon film was measured using X-ray fluorescence and converted into an equivalent thickness of the WSi$_2$ film, to reveal that the equivalent thickness was equal to the thickness of the WSi$_2$ film 14 deposited on the N-type portion 13A of the amorphous silicon film.

A higher internal pressure of the deposition chamber increases the substrate dependency of deposition of the WSi$_2$. A preferable internal pressure is around 90 Pa. The amorphous silicon film 13a used instead of the polysilicon film 13 for the deposition of the WSi$_2$ thereon allows the WSi$_2$ particles 14a to be formed with ease. Thus, a heat treatment should be performed for changing the amorphous silicon film 13a to the polysilicon film 13 after deposition of the WSi$_2$ film 14, as will be detailed hereinafter.

Subsequently, in order to remove adverse affects of the remaining gas, which is likely to remain in the WSi$_2$ film, a degassing heat treatment is performed thereto. In the degassing heat treatment, a rapid thermal annealing (RTA) is conducted at a substrate temperature of 830 degrees C. for 30 seconds while supplying argon (Ar) gas, nitrogen (N$_2$) gas or ammonium (NH$_3$) gas.

In the degassing heat treatment, the amorphous silicon film 13a becomes polycrystalline to form the polysilicon film 13 shown in FIG. 1. The three-layer structure of the amorphous silicon film 13a allows the resultant polysilicon film 13 to assume a three-layer structure wherein the three layers have different crystalline axes. This structure allows the tungsten film 17 deposited on the amorphous silicon film 13a in the subsequent step to have a function of stopper which suppresses diffusion of tungsten atoms from the tungsten film 17 toward the silicon substrate 10.

The RTA step for converting the amorphous silicon film 13a into the polysilicon film 13 should be performed at a substrate temperature of 700 degrees C. or above and for 30 seconds or longer. It is to be noted that an excessively higher temperature causes the boron to exit from the polysilicon film 13 to reduce the concentration of boron in the polysilicon film. In this respect, the RTA step should be performed at a higher limit of 950 degrees C. and for an upper limit of 10 seconds.

Figure 2E:
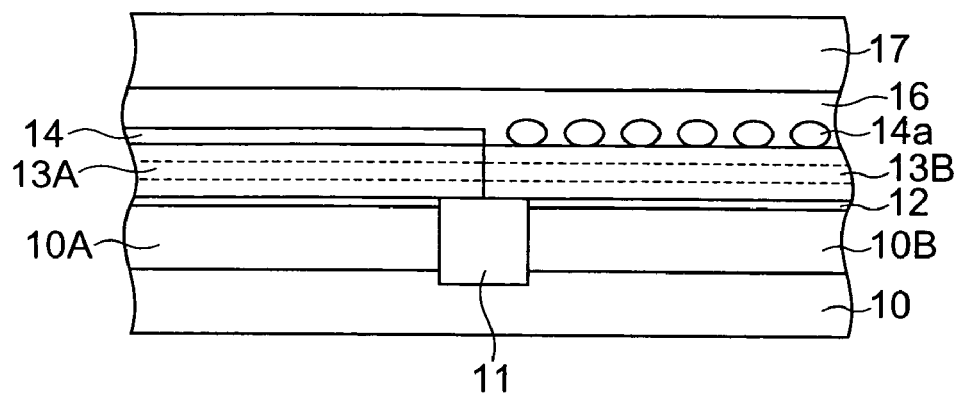

Subsequently, a pre-treatment is conducted before the sputtering of WN film 16 and W film 17. The surface of the WSi$_2$ film 14 is cleaned for 30 seconds by using HF acid to remove a native oxide film therefrom. The time length for the pre-treatment corresponds to an etching time for an around-1-nm-thick thermal oxide film. Subsequently, as shown in FIG. 2E, a 10-nm-thick WN film 16 and a 80-nm-thick W film 17 are consecutively deposited by sputtering onto the WSi$_2$ film 14 cleaned with the HF acid and onto the polysilicon film 13 exposed from the gaps between the WSi$_2$ particles 14a. These films 16 and 17 may be deposited using a CVD technique instead. The ratio of tungsten to nitrogen in the WN film may be around 1.7.

Figure 2F:
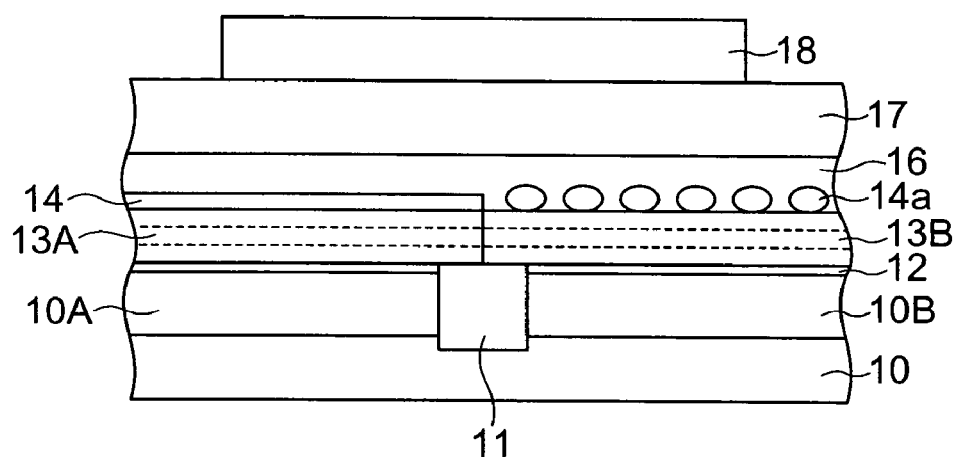
Figure 2G:
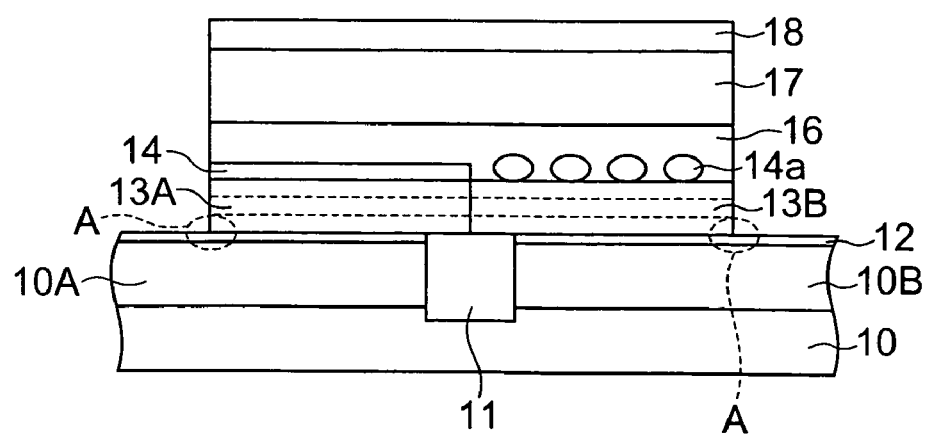

A 200-nm-thick SiN film 18 is then deposited on the W film 17 by using a CVD technique. Further, a resist film (not shown) is formed thereon by coating, followed by patterning the SiN film 18 by a dry etching technique using the resist film as a mask, to form an etching mask for a gate electrode pattern, as shown in FIG. 2F. After removing the resist film and a subsequent cleaning step, the W, WN, WSi$_2$ and polysilicon films 17, 16, 14 and 13 are selectively etched by a dry etching technique using the SiN mask pattern 18 as an etching mask, thereby forming gate electrodes 19, as shown in FIG. 2G.

During the dry etching for forming the gate electrodes 19, a portion of the gate oxide film 12, which is in contact with the edge of the gate electrode 19 and encircled by dotted circle "A", is likely to be damaged by the dry etching. Thus, following to the dry etching, an oxidizing heat treatment is performed for improving the profile around the gate electrode 19. In the oxidizing heat treatment, the silicon substrate 10 is received in a chamber, into which hydrogen gas, steam and nitrogen gas are introduced, and heated at 750 to 900 degrees C. to selectively oxidize the silicon and gate oxide film, to remedy the damaged portions caused by the dry etching.

The oxidizing heat treatment is performed for an hour or longer, to form 5-nm-thick side-wall films 20 on both the sides of the polysilicon film 13. The oxidizing heat treatment also forms a tungsten silicide nitride (WSiN) film 14 having a thickness of 5 nm or smaller at the interface between the $WSi_2$ film 14 and the WN film 16. A larger thickness of the WSiN film 15, as large as 5 nm or above, causes a higher electric resistance of the WSiN film 14, increasing the interface resistance between the WN film 16 and the amorphous silicon film 13.

Subsequently, a 40-nm-thick silicon nitride film is deposited to cover the gate electrode 19, and etched back to form the side-wall films 21 shown in FIG. 1 on both the sides of the gate electrode 19. Thereafter, impurities are implanted into the silicon substrate 10 by a self-aligned process using the gate electrode 19 including the side-wall films 21 as a mask. Thus, heavily-doped source/drain regions (not shown) are formed at locations corresponding to the gate electrode 19.

Subsequently, an RTA step is conducted at a temperature of 900 to 1100 degrees C. for 10 seconds, thereby activating the impurities in the source/drain regions. During this RTA step, the WSiN film 15 formed at the interface between the $WSi_2$ film 14 and the WN film 16 is further grown depending on the temperature and the time length of the RTA step.

As described above, according to the above embodiment, the configuration wherein the P-type portion 13B of the amorphous silicon film is doped with boron at a dosage of $1 \times 10^{15}$ to $5 \times 10^{15}$ ions/cm$^2$ and a 3- to 10-nm-thick $WSi_2$ film is deposited on the P-type potion 13B of the amorphous silicon film provides a gate electrode structure including $WSi_2$ film 14 formed of $WSi_2$ particles 14a separated from one another on the P-type portion 13B.

A preferred configuration wherein the dosage of the boron ions into the P-type portion 13B is $3 \times 10^{15}$ to $5 \times 10^{15}$ ions/cm$^2$ and the deposition thickness of the $WSi_2$ film 14 is 5 to 7 nm provides a gate electrode structure wherein the grain sizes of the $WSi_2$ particles are around 5 to 30 nm, and the gaps between adjacent $WSi_2$ particles are 2 to 80 nm.

Figure 3C:
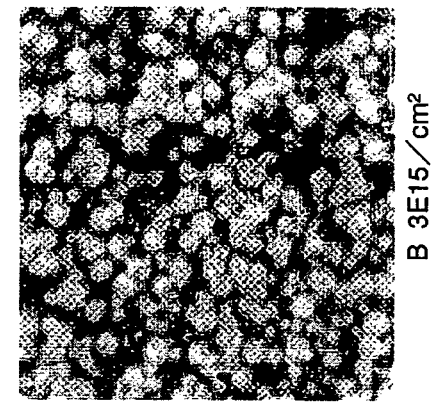
FIGS. 3A to 3E are SEM photographs of $WSi_2$ particles in 5-nm-thick amorphous silicon films doped with boron at respective dosages in a P-cannel area.
Figure 3B:
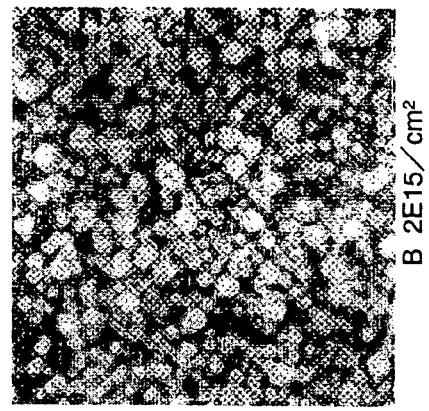
Figure 3A:
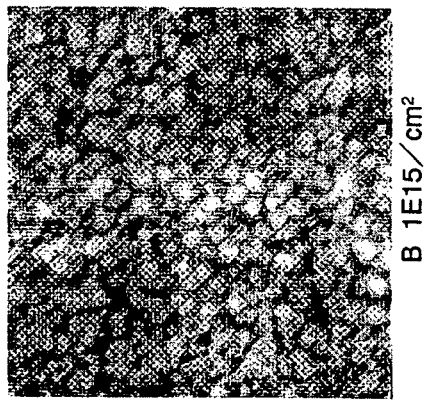
Figure 3F:
FIG. 3F shows the scale therefor.
Figure 3E:
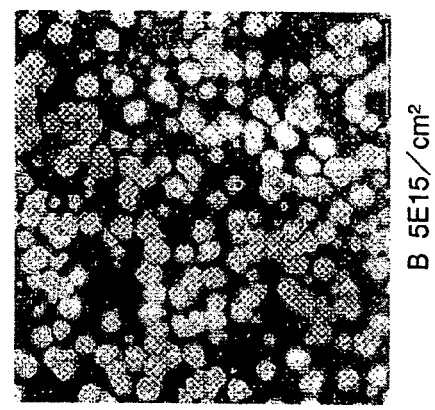
Figure 3D:
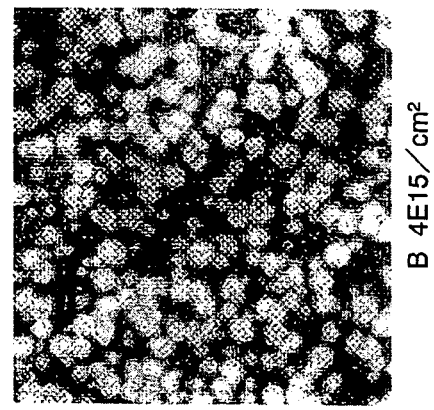
Figure 4C:
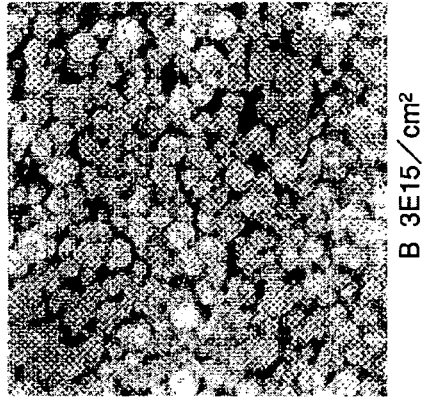
FIGS. 4A to 4E are SEM photographs of WSi2 layers particles in 7-nm-thick amorphous silicon films with boron at respective dosages in a P-channel area.
Figure 4B:
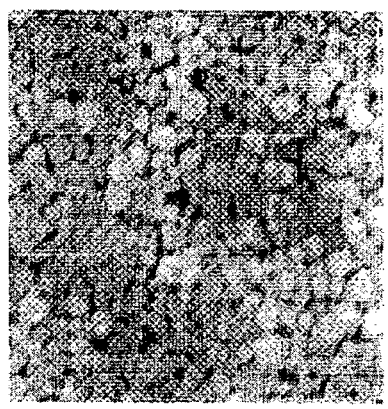
Figure 4A:
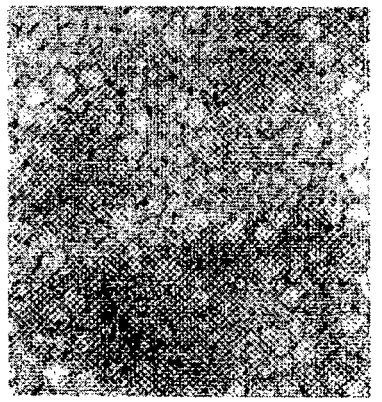
Figure 4F:
FIG. 4F shows the scale therefor.
Figure 4E:
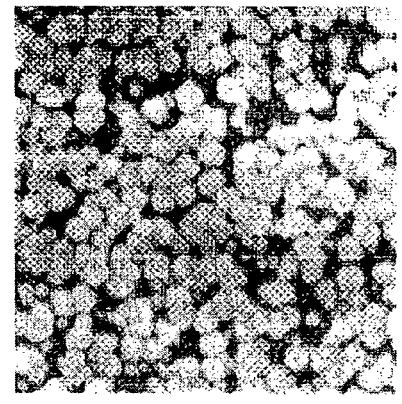
Figure 4D:
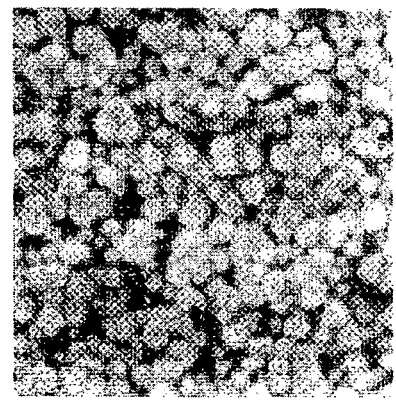

FIGS. 3A to 3E and 4A to 4E show SEM photographs of $WSi_2$ particles 14a after deposition thereof, for the different dosages of boron ions and for different thicknesses of the deposited $WSi_2$ film 14, and FIGS. 3F and 4F show the scale of 0.1 μm in these figures. FIGS. 3A to 3E show the $WSi_2$ particles 14a in the case of a deposition thickness of 5 nm for the $WSi_2$ film 14 and different dosages from 1 to $5 \times 10^{15}$ ions/cm$^2$ for the amorphous silicon film 13a, whereas FIGS. 4A to 4E show the $WSi_2$ particles 14a in the case of a deposition thickness of 7 nm and different dosages from 1 to $5 \times 10^{15}$ ions/cm$^2$.

It will be understood from those figures that a higher dosage of boron ions for the P-type portion 13B of the amorphous silicon film provides larger gaps between adjacent $WSi_2$ particles 14a, and that a larger thickness of the $WSi_2$ film 14 provides larger grain sizes of the individual $WSi_2$ particles 14a.

The sheet resistance of the $WSi_2$ film 14 on the P-type portion 13B of the amorphous silicon film was measured using a four-terminal probe technique for the different cases of FIGS. 3A to 3E and 4A to 4E. It was confirmed that the $WSi_2$ films 14 shown in FIGS. 3B to 3E and 4C to 4E had larger sheet resistances or exhibited substantially zero conductivity, whereas the $WSi_2$ films 14 shown in FIGS. 3A, 4A and 4B had lower sheet resistances. In other words, although the $WSi_2$ particles shown in FIGS. 3B to 3E and 4C to 4E exhibited excellent properties of discontinuity due to the electric isolation between the individual $WSi_2$ particles 14a, the $WSi_2$ particles shown in FIGS. 3A, 4A and 4B exhibited poor properties due to the insufficient isolation between the adjacent $WSi_2$ particles 14a. In the four-terminal probe technique, the four probes are separated from one another with a gap of 1 mm therebetween. It was noted from the inspection of the SEM photographs that the grain sizes of the $WSi_2$ particles are around 5 to 30 nm, and that the gaps between adjacent particles are around 2 to 80 nm.

FIG. 5 shows an interface resistance evaluation process conducted for measuring the interface resistance between the WN film 16 and the $WSi_2$ film 14 in the gate electrode formed in the present embodiment. In this technique, the gate electrode 19 obtained in the present embodiment had a $1 \times 1$ μm$^2$ measurement plane 22 after removing a portion of the gate electrode 19 including the HMP metal or W.

In the actual measurement, a voltage application terminal 23 and a ground terminal 24 are disposed on the tungsten film 17, with the interface resistance measurement plane 22 in contact with the potential measurement terminal 26 being sandwiched therebetween. The terminals 23, 24 and 26 are coupled to the respective films via probe electrodes 25. A voltage is applied between the voltage application terminal 23 and the ground terminal 24, while monitoring the potential difference between the potential measurement terminal 26 and the ground terminal 24 and the resultant current. The interface resistance was calculated based on the voltage and the current thus measured.

Figure 6:
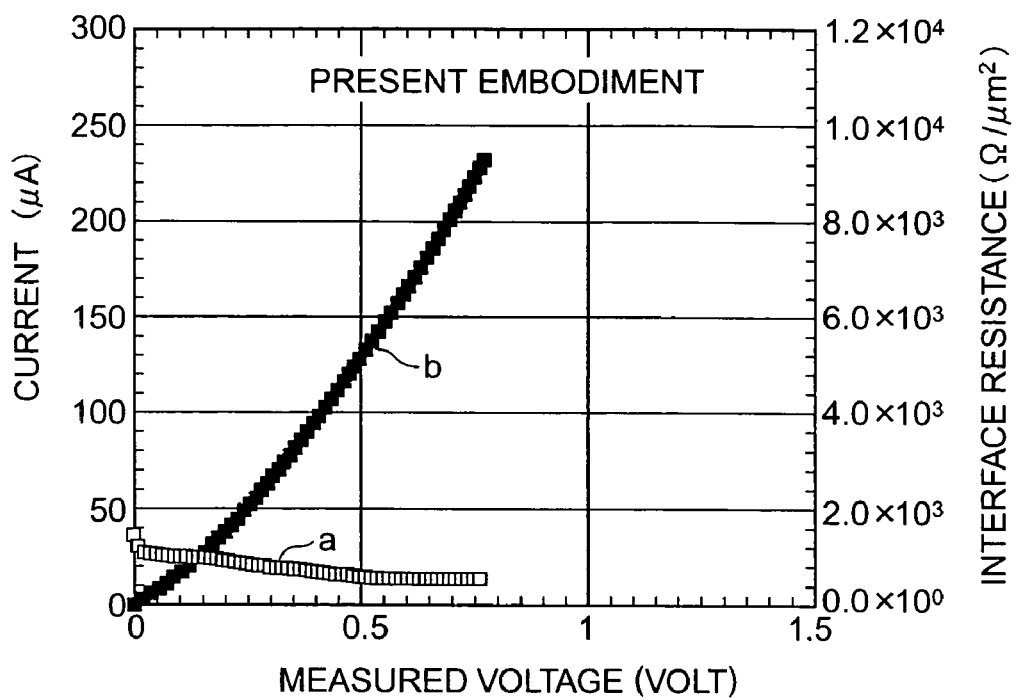
FIG. 6 is a graph showing the relationships between the current and the differential potential and between the interface resistance and the differential potential in the semiconductor device of the present embodiment.
Figure 7:
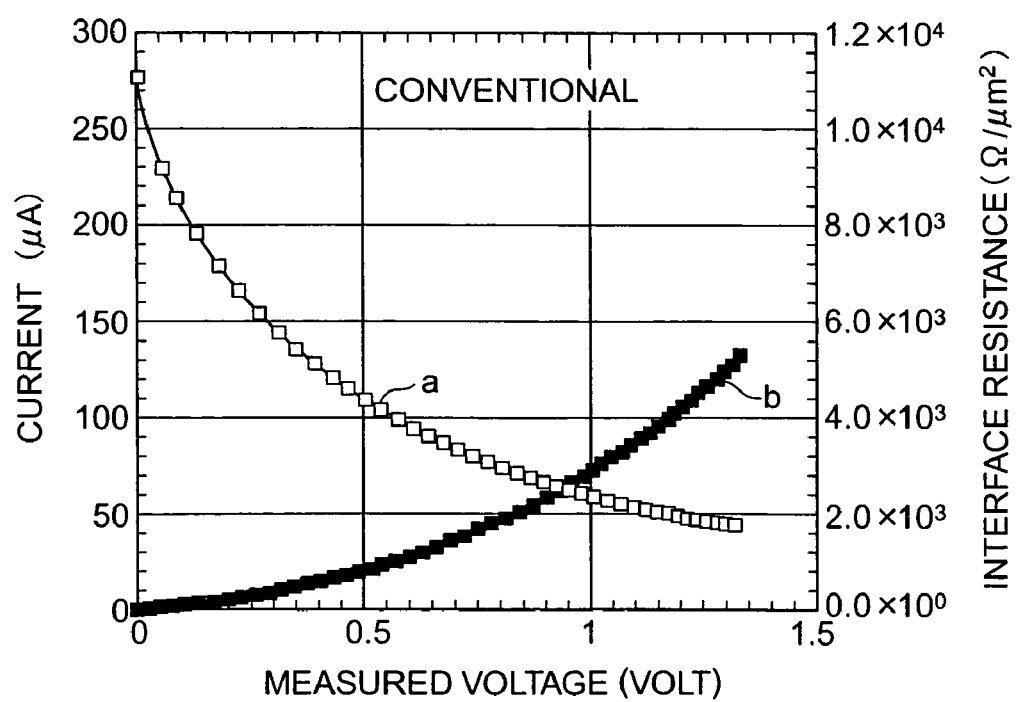
FIG. 7 is a graph showing the relationships between the current and the differential potential and between the interface resistance and the differential potential in the gate electrode in the present embodiment.

FIGS. 6 and 7 show the results of the measurements of the interface resistance for the gate electrode in the present embodiment and for the gate electrode in a semiconductor device of the conventional technique, respectively. The semiconductor device of the conventional technique was such that a uniform $WSi_2$ film was deposited on the polysilicon film. In these figures, the potential (voltage) of the potential measurement terminal 26 is plotted on abscissa for representing the voltage applied to the gate electrode 19 whereas the resultant current (μA) and the interface resistance (Ω/μm$^2$) are plotted on ordinate, and graphs "a" and "b" represent the interface resistance and the measured current, respectively.

As understood from the graph "a" of FIG. 7, a lower voltage provides a higher interface resistance as well as a higher voltage dependency of the interface resistance. This reveals the non-linearity of the resultant current shown by the graph "b" in FIG. 7. In addition, the interface resistance was as high as around 8 kΩ at a measured voltage of 0.1 volt. On the other hand, as understood from the graph "a" of FIG. 6, the interface resistance has a lower voltage dependency, and accordingly, the resultant current has a substantially linear relationship with respect to the applied voltage. In addition, the interface resistance itself has a lower value as low as around 1 kΩ at the measured voltage of 0.1 volt. This assures the semiconductor device to operate at a lower operational voltage or gate voltage.

FIG. 8 shows the relationship between the interface resistance in the gate electrode and the gate size for different dosages of the boron ions, i.e., different grain sizes of the $WSi_2$ particles, wherein the size (length) of the polysilicon film is plotted on abscissa and the interface resistance at the measured voltage of 0.1 volt is plotted on ordinate. In the samples manufactured by the method of the present embodiment, the thickness of the $WSi_2$ film was fixed at 5 nm, whereas the P-type portion 13B had different dosages of boron ions from 1 to $5 \times 10^{15}$ ions/cm$^2$. The actually measured values were averaged for 20 samples, and the averaged values are plotted in FIG. 8.

As understood from FIG. 8, a higher boron dosage in the P-type portion 13B provided a lower interface resistance, the higher boron dosage corresponding to larger grain sizes of the $WSi_2$ particles. The lower interface resistance provided by the higher grain size is considered to result from the fact that a higher boron dosage provides a lower resistance portion in the gap between adjacent $WSi_2$ particles, the lower resistance portion being the dominant factor determining the interface resistance in the gate electrode. This is contrary to the concern that the P-type portion of the polysilicon film and the WN film may react therebetween to increase the interface resistance because the P-type portion and the WN film are in direct contact with each other via the gap formed between the $WSi_2$ particles to form a thick WSiN film.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising:
    a semiconductor substrate having an N-channel area and a P-channel area; and
    an N-channel transistor and a P-channel transistor formed in said N-channel area and said P-channel area, respectively, said N-channel transistor and said P-channel transistor having respective gate electrodes each having a layered structure including a polysilicon film doped with impurities, a high-melting-point (HMP) metal silicide film, a HMP metal nitride film and a HMP metal film, wherein said HMP metal silicide film of said gate electrode of said P-channel transistor has a discontinuous film structure.

2. The semiconductor device according to claim 1, wherein both said HMP metal silicide film and said HMP metal nitride film include a HMP metal same as the HMP metal in said HMP metal film.

3. The semiconductor device according to claim 1, wherein said discontinuous structure includes a plurality of silicide particles having grain sizes of 5 to 30 nm.

4. The semiconductor device according to claim 3, wherein most of gaps between adjacent said silicide particles are 2 to 80 nm.

5. The semiconductor device according to claim 1, wherein said HMP metal silicide film, said HMP metal nitride film and said HMP metal film include a HMP metal selected from the group consisting of tungsten, cobalt, titanium, nickel and tantalum.

6. The semiconductor device according to claim 1, wherein said impurities are boron ions.

7. The semiconductor device according to claim 1, wherein said layered structure further includes a HMP metal silicide nitride film adjacent to said HMP metal silicide film having said discontinuous film structure, said HMP metal silicide nitride film including a HMP metal same as a HMP metal in said HMP metal silicide film.

8. The semiconductor device according to claim 1, wherein said semiconductor device has a dual-gate structure.

9. A method for manufacturing a semiconductor device comprising the steps of:
    forming a gate oxide film on a semiconductor substrate including an N-channel area and a P-channel area in pair;
    depositing a silicon film including polysilicon or amorphous silicon on said gate oxide film;
    doping a first portion of said silicon film in said P-channel area with P-type impurities at a dosage of $1\times10^{15}$ to $5\times10^{15}$ ions/cm$^2$, and a second portion of said silicon film in said N-channel area with N-type impurities;
    depositing a high-melting-point (HMP) metal silicide "having a discontinuous film structure" on said doped silicon film at a uniform deposition rate between said P-channel area and said N-channel area, said uniform deposition rate depositing said HMP metal silicide film to a thickness of 3 to 10 nm; and
    forming N-channel transistor and P-channel transistor in said N-channel area and said P-channel area, respectively, said N-channel transistor and P-channel transistor having respective gate electrodes, said gate electrodes including said doped polysilicon film, said HMP metal silicide film, a HMP metal nitride film and a HMP metal film.

10. The method according to claim 9, wherein said thickness is 5 to 7 nm.

11. The method according to claim 9, further comprising, after said HMP metal silicide film depositing step, the step of heat treating said silicon film to convert said silicon film including amorphous silicon into a polysilicon film.

12. The method according to claim 9, wherein said HMP metal silicide film depositing step is performed under a deposition pressure of 30 to 100 Pa.

13. The method according to claim 9, wherein said doping step dopes said first portion of said silicon film at a dosage of not lower than $3\times10^{15}$ ions/cm$^2$.

14. The method according to claim 9, wherein said HMP metal silicide film, said HMP metal nitride film and said HMP metal film include a HMP metal selected from the group consisting of tungsten, cobalt, titanium, nickel and tantalum.

15. The method according to claim 9, wherein said P-type impurities are boron ions.

* * * * *